United States Patent
Aritome

(10) Patent No.: US 7,336,541 B2
(45) Date of Patent: Feb. 26, 2008

(54) NAND FLASH MEMORY CELL PROGRAMMING

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/599,702

(22) Filed: Nov. 15, 2006

(65) Prior Publication Data

US 2007/0058465 A1  Mar. 15, 2007

Related U.S. Application Data

(62) Division of application No. 11/197,641, filed on Aug. 4, 2005, now Pat. No. 7,212,447.

(51) Int. Cl.
*G11C 11/34* (2006.01)
(52) U.S. Cl. .................. 365/185.25; 365/185.13; 365/185.17; 365/185.18
(58) Field of Classification Search ........... 365/185.25, 365/185.13, 185.17, 185.18
See application file for complete search history.

(56) References Cited

U.S. PATENT DOCUMENTS

| | | | |
|---|---|---|---|
| 5,257,225 A | 10/1993 | Lee | |
| 5,357,463 A | 10/1994 | Kinney | |
| 5,677,873 A | 10/1997 | Choi | |
| 5,748,526 A | 5/1998 | Lee | |
| 5,754,482 A | 5/1998 | Su et al. | |
| 6,049,494 A | 4/2000 | Sakui et al. | |
| 6,259,624 B1 | 7/2001 | Nobukata | |
| 6,487,117 B1 | 11/2002 | Choi | |
| 6,741,519 B2 | 5/2004 | Forbes et al. | |
| 6,813,187 B2 | 11/2004 | Lee | |
| 6,826,071 B2 | 11/2004 | Mullarkey et al. | |
| 6,975,538 B2 | 12/2005 | Abedifard et al. | |
| 6,977,842 B2 | 12/2005 | Nazarlan | |
| 7,006,382 B2 | 2/2006 | Pekny et al. | |
| 7,095,653 B2 | 8/2006 | Abedifard | |
| 7,120,055 B2 | 10/2006 | Kessenich | |
| 7,142,459 B2 | 11/2006 | Pekny et al. | |
| 7,154,785 B2 | 12/2006 | Roohparvar | |
| 7,180,786 B2 * | 2/2007 | Mastrangelo et al. | ... 365/185.23 |
| 7,212,436 B2 | 5/2007 | Li | |
| 7,212,447 B2 | 5/2007 | Aritome | |
| 2003/0137867 A1 | 7/2003 | Salling | |

(Continued)

OTHER PUBLICATIONS

U.S. Appl. No. 11/197,641 Notice of allowance mailed Jan. 11, 2007, 13 pgs.

(Continued)

*Primary Examiner*—Tuan T. Nguyen
(74) *Attorney, Agent, or Firm*—Schwegman, Lundberg & Woessner, P.A.

(57) ABSTRACT

A flash memory device, such as a NAND flash, is included having an array of floating gate transistor memory cells arranged in a first and second addressable blocks. A voltage source to supply programming voltages to control gates of the floating gate transistor memory cells is provided. The voltage source supplies a pre-charge voltage to the control gates of the floating gate transistor memory cells located in the first addressable block when data is programmed in memory cells of the second addressable block. Methods for pre-charging word lines in unselected array blocks are included.

11 Claims, 7 Drawing Sheets

U.S. PATENT DOCUMENTS

| | | |
|---|---|---|
| 2003/0214846 A1 | 11/2003 | Koelling et al. |
| 2003/0218493 A1 | 11/2003 | Lee |
| 2004/0124876 A1 | 7/2004 | Plants |
| 2004/0136243 A1 | 7/2004 | Koelling et al. |
| 2005/0007152 A1 | 1/2005 | Dhong et al. |
| 2005/0007813 A1 | 1/2005 | Adams et al. |
| 2005/0057966 A1 | 3/2005 | Nazarian |
| 2005/0078520 A1 | 4/2005 | Kim |
| 2005/0111260 A1 | 5/2005 | Nazarian |
| 2005/0152188 A1 | 7/2005 | Ju |
| 2005/0162918 A1 | 7/2005 | Kim et al. |
| 2005/0213378 A1 | 9/2005 | Chang |
| 2005/0232012 A1 | 10/2005 | Park |
| 2006/0044872 A1 | 3/2006 | Nazarian |
| 2006/0083045 A1* | 4/2006 | Kamoshida et al. .......... 365/63 |
| 2007/0030737 A1 | 2/2007 | Aritome |

OTHER PUBLICATIONS

"NAND Flash Performance Increase with Program Page Cache Mode Command", *Micron, TN-29-14: Increasing NAND Flash Performance Overview*, (2006), 1-10.

Cooks, Jim, "Flash Memory Technology Direction", WinHEC, (2007), 1-11.

* cited by examiner

NAND FLASH MEMORY CELL PROGRAMMING

RELATED APPLICATION

This application is a Divisional of U.S. application Ser. No. 11/197,641, filed Aug. 4, 2005 now U.S. Pat. No. 7,212,447, which is incorporated herein by reference.

FIELD OF THE INVENTION

The present invention relates to non-volatile memory devices and, more particularly, to programming of non-volatile memory cells.

BACKGROUND

Flash memory is non-volatile, which means that it stores information on a semiconductor in a way that does not need power to maintain the information in the chip. Flash memory is based on the Floating-Gate Avalanche-Injection Metal Oxide Semiconductor (FAMOS transistor) which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array. Further, flash memory stores information in an array of transistors, called "cells", each of which traditionally stores one or more bits of information.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cells source and drain connections, depending on the Vt of the cell. This presence or absence of current is sensed and translated into 1's and 0's, reproducing the stored data.

For reasons stated below which will become apparent to those skilled in the art upon reading and understanding the present specification, there is a need for methods and devices to program floating gate transistors.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

Figure 1:
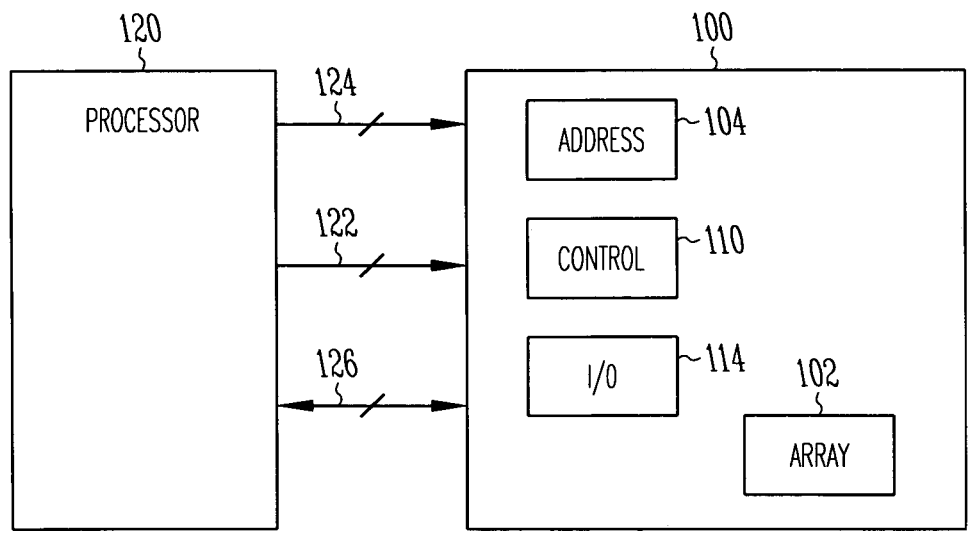
FIG. 1 is a simplified block diagram of an integrated circuit dynamic memory device in accordance with an embodiment of the invention.

FIG. 1 is a simplified block diagram of an integrated circuit dynamic memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as flash memory cells because blocks of memory cells are erased concurrently in a flash operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data is written to or read from the memory cells across data, DQ, lines 126.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Flash memory is nonvolatile memory that can be erased and reprogrammed in units of memory called blocks. A write operation in any flash device can only be performed on an empty/erased unit, so in most cases an erase operation must precede the write operation.

Figure 2:
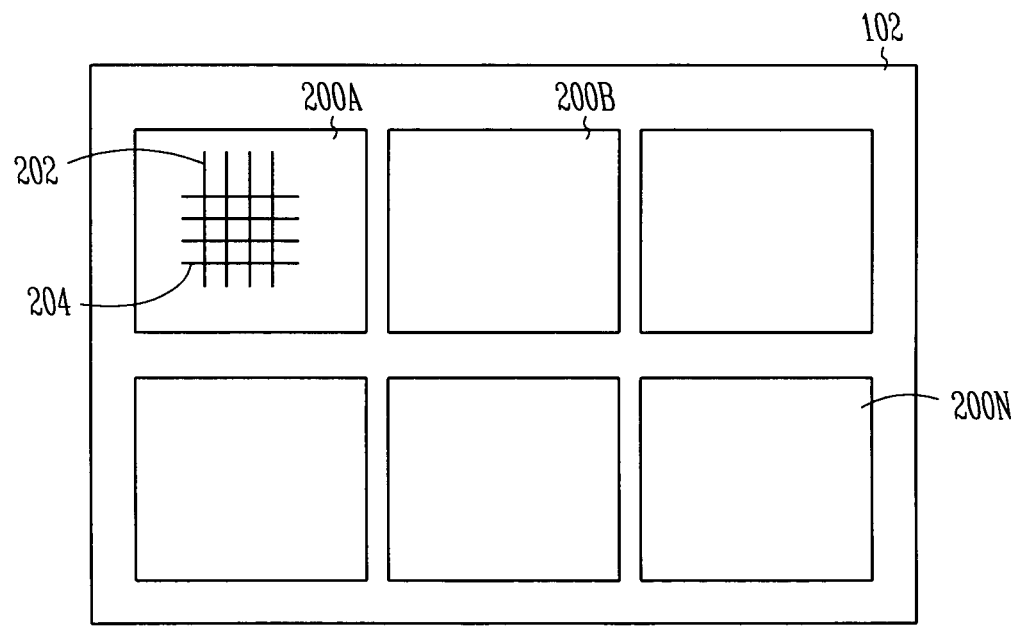
FIG. 2 illustrates a block diagram of a memory device array according to an embodiment of the invention.

FIG. 2 is a simplified block diagram of an example array 102 having a plurality of array erase blocks 200a-200n. The size and number of erase blocks are not relevant to the present invention. Further, the erase blocks may not be physically separate, but can be defined by erase operations. In one embodiment, the memory includes at least 2000 blocks.

Each erase block includes memory cells arranged generally in columns 202 and rows 204. The rows of cells are coupled to word line conductors and the columns are coupled to bit line conductors.

Figure 3:
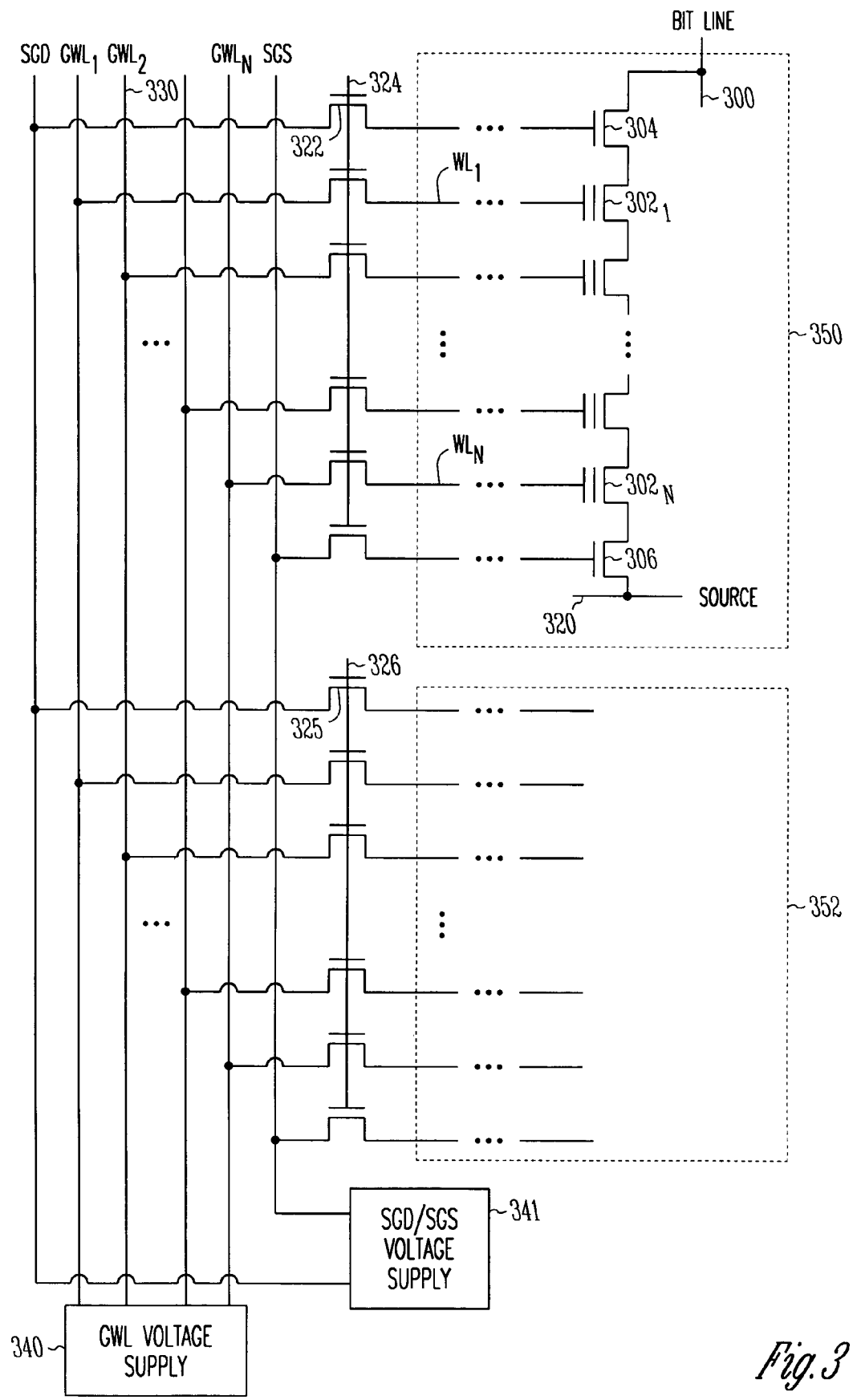
FIG. 3 is a partial schematic diagram of a NAND flash array according to an embodiment of the invention.

FIG. 3 illustrates a simplified portion of a NAND flash memory of the present invention. For simplicity, two array blocks 350 and 352 are illustrated. For purposes of explaining operation of the memory block, 350 is referred to herein as being a selected block because a memory cell in that block is selected for programming. Block 352 is referred to herein as being an unselected block because it does not contain the memory cell selected for programming.

In block 350, a bit line 300 is coupled to a series of non-volatile floating gate transistor memory cells $302_1$-$302_n$ via drain select transistor 304. The memory cells are coupled to a source line 320 via a source select transistor 306. Control gates of the memory cells are coupled to word lines ($WL_1$-$WLn$).

Each word line can be selectively coupled to one of a plurality of Global Word Lines (GWL) 330 through a driver transistor 322. Each GWL is coupled to receive voltages from a voltage supply 340. A voltage supply 341 is coupled to provide a gate voltage to the drain select transistor 304 and the source select transistor 306.

During operation, the gate 324 of driver transistors 322 of block 350 are controlled to couple all of the word lines of a NAND group of memory cells to selected voltage levels, as explained below. The term Global Word Lines (GWL) refers to the hierarchical structure of word line conductors. As such, the GWL's are used to provide signals to multiple word lines of the array.

Block 352, and any other unselected blocks in the array, are coupled to a word line pre-charge voltage through driver transistors 325 and a respective driver gate signal on gate 326, as explained below.

In a read operation, a word line, for example $WL_1$ of a target (selected) memory cell $302_1$, is maintained at a low voltage level. All unselected cell word lines $WL_2$-$WLn$ are coupled to a voltage sufficiently high to activate the unselected cells regardless of their floating gate charge. If the selected cell $302_1$ has an uncharged floating gate, it is activated. The bit line 300 and source line 320 are then coupled through the series of memory cells. If the selected cell $302_1$ has a charged floating gate it will not activate. The bit line 300 and source line 320, therefore, are not coupled through the series of memory cells.

In prior art program operations word lines in unselected array blocks, such as block 352, of the memory array are coupled to zero volts. Unselected refers to array blocks not containing the memory cell(s) being programmed. The word lines in a selected array block are coupled to either a program voltage (Vpgm) or an intermediate voltage (Vpass). The Vpgm is coupled to the word line of the memory cell selected to be programmed and the Vpass is coupled to all of the unselected word lines of the selected block. For example, the Vpgm and Vpass voltages are about 10 volts and 20 volts, respectively for prior art 3.3 volt NAND memory devices. This prior art biasing during programming operations can result in source-drain punch through and snap-back problems in the driver transistors 322 and 325.

In embodiments of the present invention, word lines of selected and unselected blocks are pre-charged to a low level, such as one volt. The pre-charge voltage can be coupled through the GWLs 330 and driver transistors 322 and 325, or a secondary biasing circuit. Further, the pre-charge operation can be limited to the unselected blocks in some embodiments.

Figure 4:
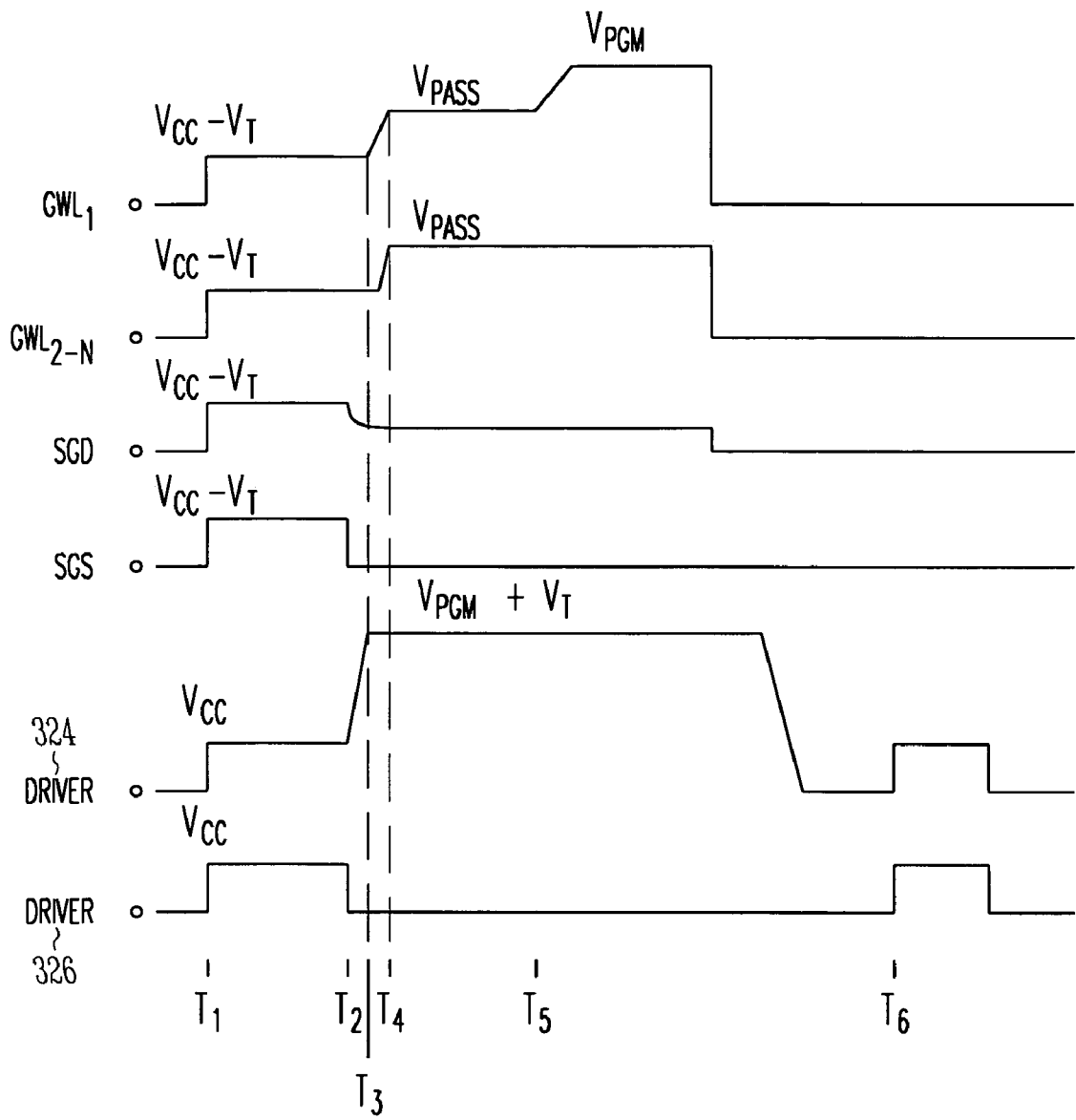
FIG. 4 is a timing diagram of an example program operation of the memory of FIG. 2.

Referring to FIG. 4, a timing diagram illustrates relative voltage levels of the global word line $GWL_1$, global word lines $GWL_2$-$GWL_n$, a gate driver signal 326 for unselected blocks, a gate driver signal 324 for a selected block, select gate drain SGD, and select gate source SGS.

For the following example, memory cell $302_1$ is selected for programming. As such, $WL_1$ is the selected word line and $WL_2$ to $WLn$ are the unselected word lines for block 350. A signal on global word line $GWL_1$ is controlled to provide the program voltage Vpgm to $WL_1$. Likewise signals on $GWL_2$ to $GWLn$ are controlled to provide an intermediate voltage, Vpass, to word lines $WL_2$ to $WLn$.

At time T1 of FIG. 4, the $GWL_1$ and $GWL_2$ to $GWLn$ voltages are increased from zero to a VCC voltage. The gate signals 324 and 326 of driver transistors 322 and 325 are activated with a level of VCC. Thus, the word lines in the unselected blocks are pre-charged to VCC-Vt via their respective GWL signals. The word lines in the selected block can also be coupled to the GWL pre-charge voltage Vcc-Vt through their respective driver transistors. As such, the word lines in at least the unselected array blocks are pre-charged during a program operation. The pre-charge voltage level can be VCC-Vt as illustrated, but is not limited thereto. For example, a one volt pre-charge level could be selected in an embodiment.

Also at time T1, the drain select gate (SGD) and source select gate (SGS) signals are coupled to VCC-Vt to pre-charge.

The gate signal 324 for drive transistors 322 is increased from VCC to Vpgm+Vt. That is, for an N-channel driver transistor the gate signal is desired to be a threshold voltage, Vt, above the highest coupled through voltage. In this embodiment, a program voltage Vpgm is the highest level to be coupled through the drive transistors. As such, the word lines of the selected block 350 are coupled to Vpass from the GWL's.

A time T2, the driver transistors 325 of word lines in unselected blocks, such as block 352, are turned off to isolate the word lines from the GWL signals. The word lines in the unselected blocks remain pre-charged following time T1 until discharged. Also at time T2, the drain select gate (SGD) signal is decreased to a level such as ½ VCC and source select gate (SGS) signal returns to zero.

At time T3 after driver signal 324 reaches Vpgm+Vt, the $GWL_1$ voltage is increased from VCC to an intermediate voltage, Vpass. In one embodiment, Vpass is about 10 volts. At time T4, the $GWL_2$ to $GWLn$ voltage levels are increased to Vpass.

A time T5, the $GWL_1$ voltage level is increased from Vpass to the high program voltage, Vpgm. In one embodiment, Vpgm is about 20 volts. The selected word line WL, in the selected block 350 is coupled to $GWL_1$ to charge it to Vpgm through its respective driver transistor. The voltage levels of $GWL_2$ to $GWLn$ remain at Vpass. With the selected word line $WL_1$ at Vpgm the selected memory cell $302_1$ is programmed.

As an option, at time T6 following the program operation, the driver transistors 322 and 325 are activated while the voltage level on $GWL_1$ to $GWLn$ are at zero volts. All of the word lines in selected and unselected blocks, therefore, are discharged.

Figure 5:
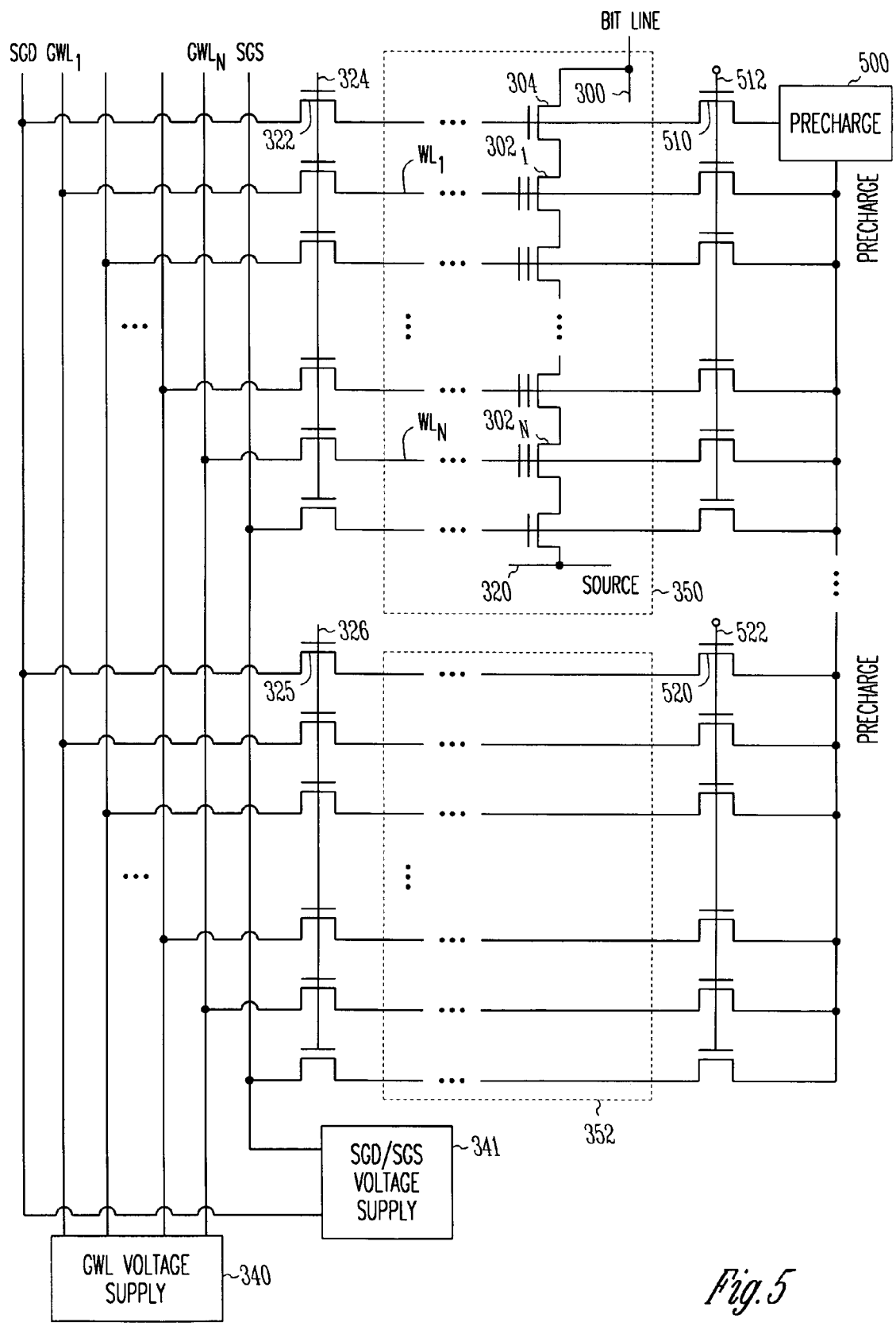
FIG. 5 illustrates a partial schematic diagram of a NAND flash array according to another embodiment of the invention.
Figure 6:
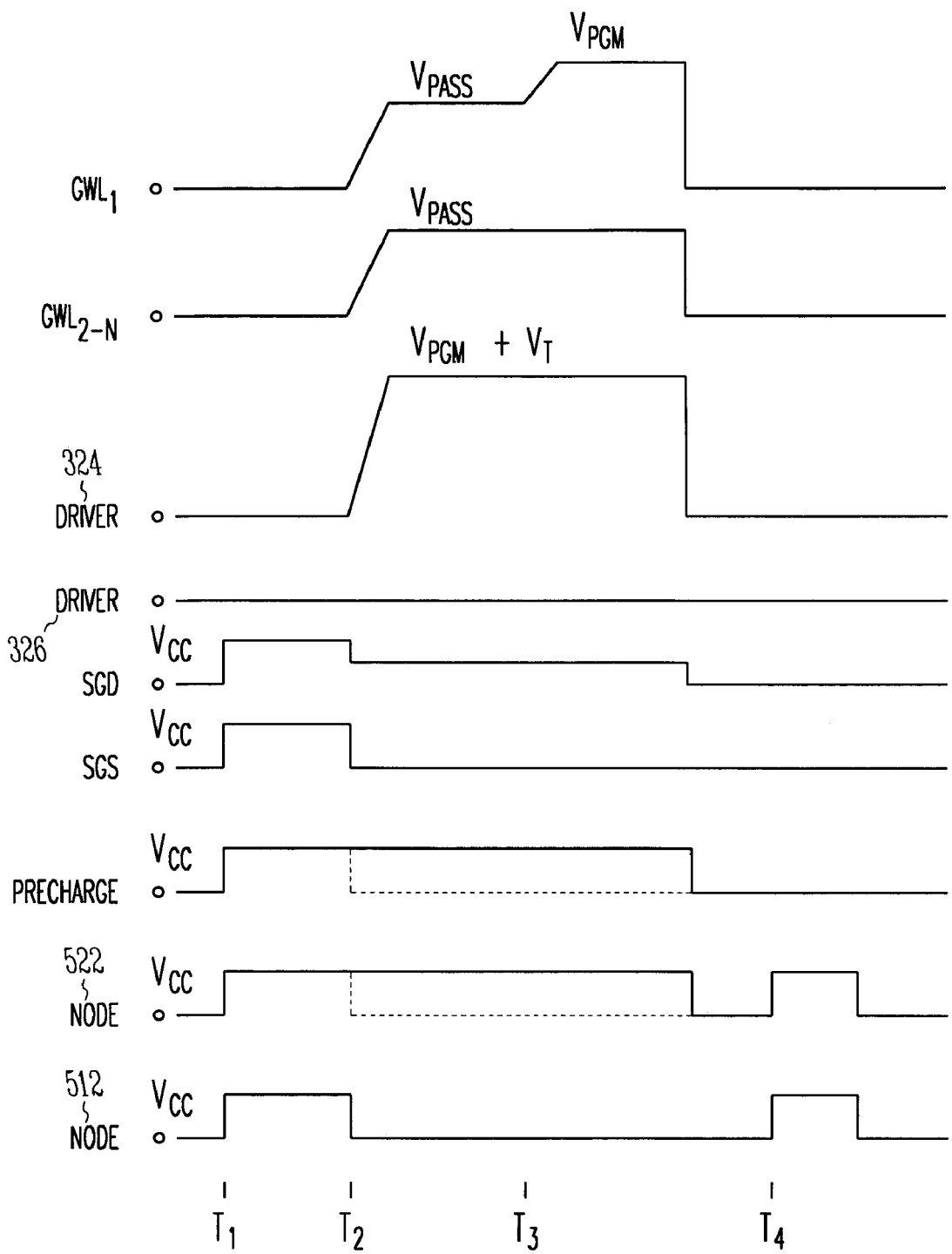
FIG. 6 is a timing diagram of an example program operation of the memory of FIG. 5.
Figure 7:
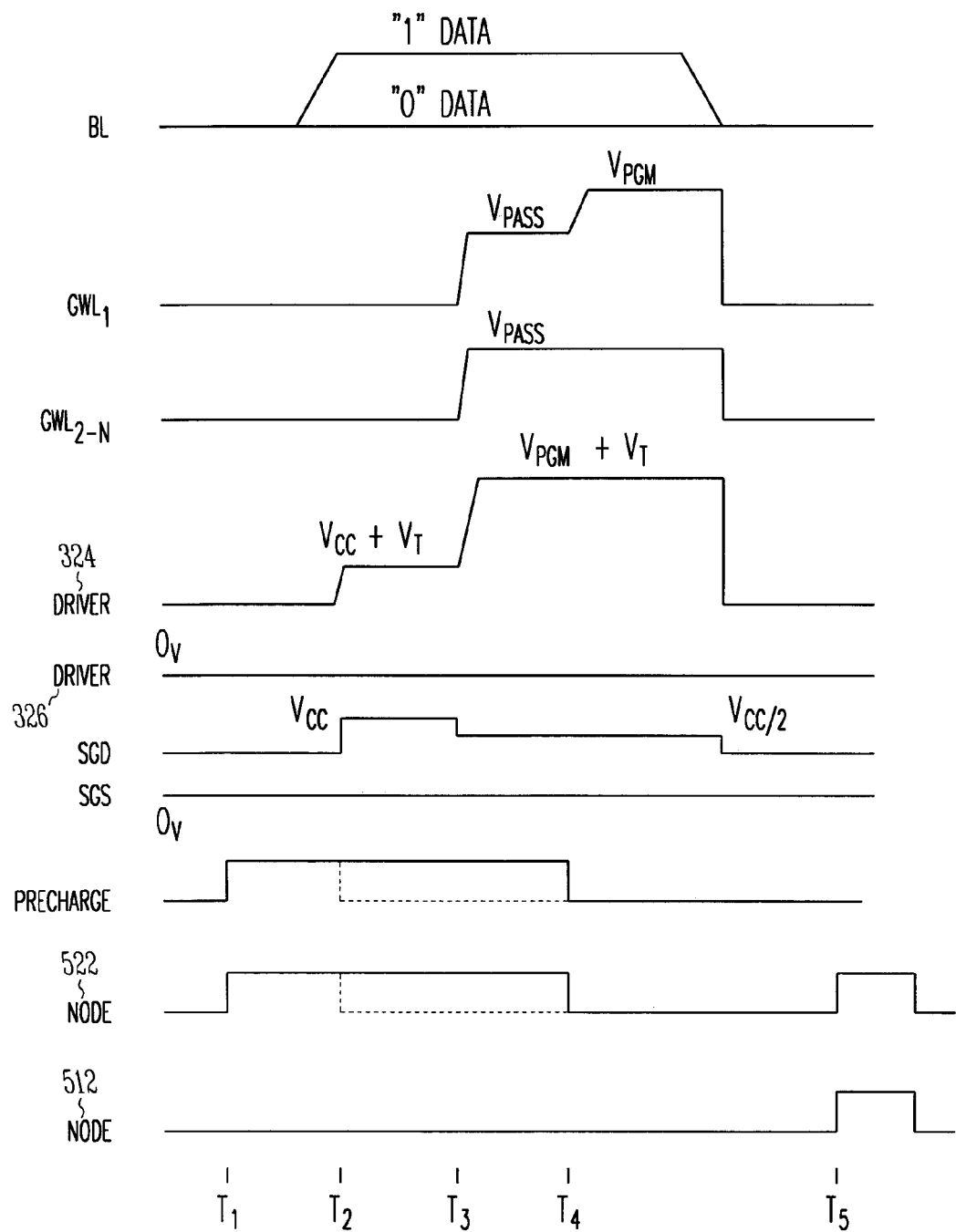
FIG. 7 is a timing diagram of an alternate embodiment operation.
Figure 8:
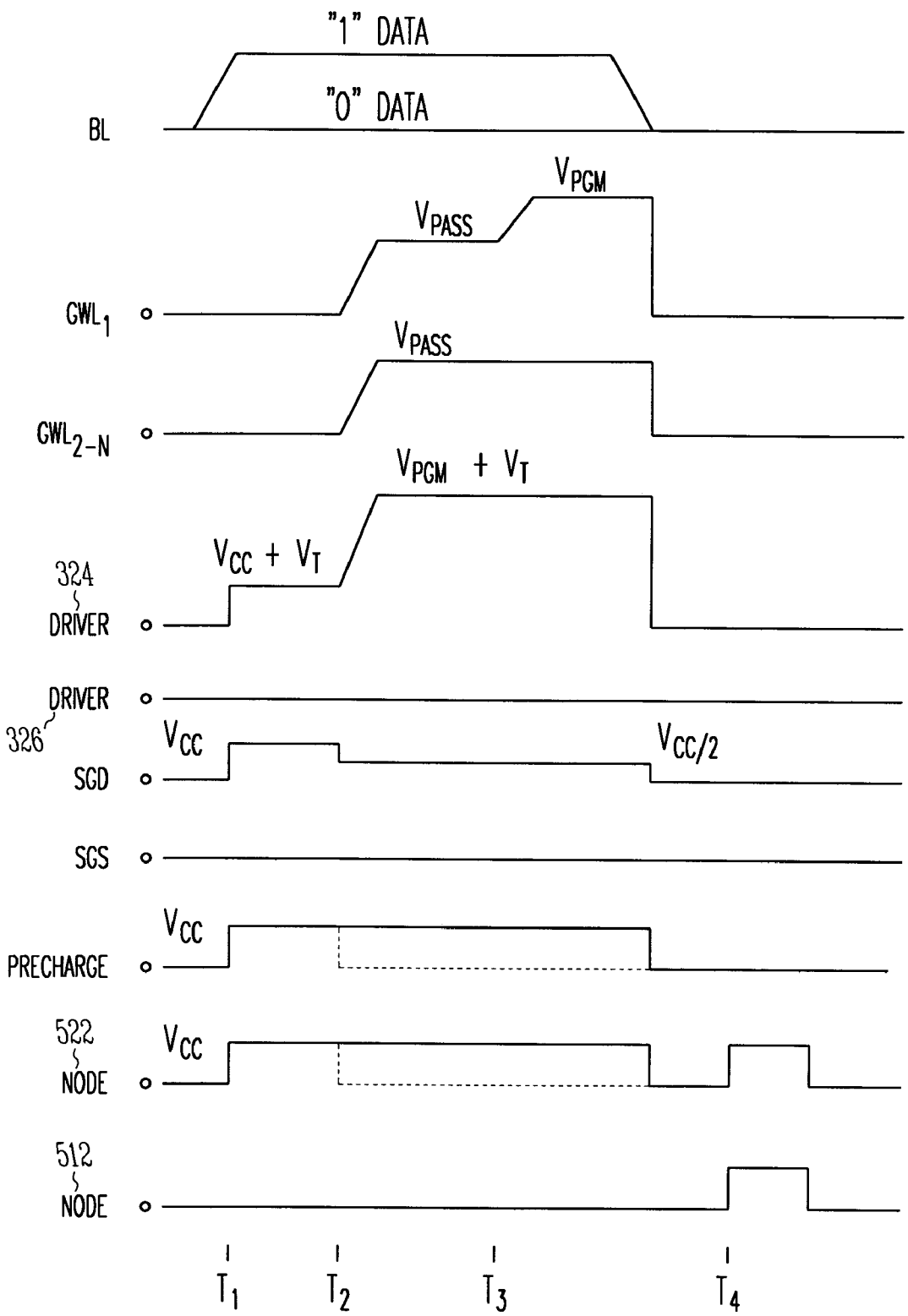
FIG. 8 is a timing diagram of another embodiment operation.

The above embodiments use the global word lines to pre-charge the word lines during a program operation. FIG. 5 illustrates an alternate embodiment for pre-charging word lines in the memory array blocks. A pre-charge circuit 500 is selectively coupled to word lines $WL_1$-$WLn$ of the array blocks through transistors 510 and 520. In this embodiment, the GWL voltage supply 340 provides the Vpass and Vpgm voltages for the active block, but not the pre-charge voltage for the inactive blocks. Example timing diagrams of operations of FIG. 5 are provided in FIGS. 6-8. In FIG. 6 the word lines of the selected and unselected blocks are both pre-charged before programming the selected block. In FIG. 7, the word lines of the unselected block are pre-charged prior to programming the selected block. In FIG. 8 the word lines of the unselected block are pre-charged while programming the selected block.

At time T1 of FIG. 6, the $GWL_1$ and $GWL_2$ to GWLn voltages are at zero volts. The precharge signal from circuit 500 transitions to VCC and the gates 512 and 522 of transistors 510 and 520 are activated to precharge the word lines and select lines.

The word lines in the unselected blocks are pre-charged to the precharge level, VCC. The word lines in the selected block can also be coupled to the precharge voltage through transistors 510. As such, the word lines in at least the unselected array blocks are pre-charged during a program operation. The pre-charge voltage level can be VCC, but is not limited thereto. For example, a one volt pre-charge level could be selected in an embodiment.

With transistor 510 activated, the data level of the bit line (BL) 300 is substantially coupled to the selected block in preparation for programming. A time T2, transistors 510 are turned off by node 512 to isolate the word lines of the selected block 350 from the precharge voltage. The pre-charge signal can remain at the precharge voltage, or optionally return to ground. Also, transistors 520 can remain active via node 522 if the precharge signal remains high. As such, the word lines and select gate signals of the unselected blocks can be actively precharged during some or all of the program operation.

The $GWL_1$ and $GWL_2$ to GWLn voltages are increased at time T2 from ground to the intermediate voltage, Vpass. In one embodiment, Vpass is about 10 volts. The driver transistors 325 of word lines in unselected blocks 352 remain turned off via signal 326 to isolate the word lines from the GWL signals. The gate signal 324 for drive transistors 322 is increased from VCC to Vpgm+Vth, as explained above. As such, the word lines of the selected block 350 are coupled to Vpass. Also at time T2, the drain select gate (SGD) signal is coupled to a level such as ½ VCC using supply 341.

At time T3, the $GWL_1$ voltage level is increased from Vpass to the high program voltage, Vpgm. In one embodiment, Vpgm is about 20 volts. The selected word line $WL_1$ in the selected block 350 is coupled to $GWL_1$ to charge it to Vpgm through its respective driver transistor. The voltage levels of $GWL_2$ to GWLn remain at Vpass. With the selected word line $WL_1$ at Vpgm the selected memory cell $302_1$ is programmed.

As an option, at time T4 following the program operation, transistors 510 and 520 (via nodes 512 and 522) are activated while the precharge circuit 500 provides a voltage of zero volts. All of the word lines in selected and unselected blocks, therefore, are discharged.

An alternate embodiment is illustrated in the timing diagram of FIG. 7. At time T1 the precharge signal from circuit 500 transitions to VCC and the gates (node 522) of transistors 520 are activated to precharge the word lines and select lines of the unselected block 352. At time T2 the precharge signal can remain at the precharge voltage, or optionally return to ground. Also, transistors 520 can remain active via node 522 if the precharge signal remains high. As such, the word lines and select gate signals of the unselected blocks can be actively precharged during some or all of the program operation.

Also at time T2, the drain select gate (SGD) signal transitions to Vcc and driver 324 signal transitions to Vcc+Vt to activate transistor 304. As such the data on bit line (BL) 300 is coupled to the selected block 350.

At time T3, the SGD signal is coupled to a level such as ½ VCC using supply 341. The $GWL_1$ and $GWL_2$ to GWLn voltages are increased at time T3 from ground to the intermediate voltage, Vpass. In one embodiment, Vpass is about 10 volts. The driver transistors 325 of word lines in unselected blocks 352 remain turned off via signal 326 to isolate the word lines from the GWL signals. The gate signal 324 for drive transistors 322 is increased from VCC to Vpgm+Vth, as explained above. As such, the word lines of the selected block 350 are coupled to Vpass.

At time T4, to program the selected block, the $GWL_1$ voltage level is increased from Vpass to the high program voltage, Vpgm. In one embodiment, Vpgm is about 20 volts. The selected word line $WL_1$ in the selected block 350 is coupled to $GWL_1$ to charge it to Vpgm through its respective driver transistor. The voltage levels of $GWL_2$ to GWLn remain at Vpass. With the selected word line $WL_1$ at Vpgm the selected memory cell $302_1$ is programmed.

As an option, at time T5 following the program operation, transistors 510 and 520 (via nodes 512 and 522) are activated while the precharge circuit 500 provides a voltage of zero volts. All of the word lines in selected and unselected blocks, therefore, are discharged.

Another embodiment is illustrated in the timing diagram of FIG. 8. At time T1 the precharge signal from circuit 500 transitions to VCC and the gates (node 522) of transistors 520 are activated to precharge the word lines and select lines of the unselected block 352. At time T2 the precharge signal can remain at the precharge voltage, or optionally return to ground. Also, transistors 520 can remain active via node 522 if the precharge signal remains high. As such, the word lines and select gate signals of the unselected blocks can be actively precharged during some or all of the program operation.

Also at time T1, the drain select gate (SGD) signal transitions to Vcc and driver 324 signal transitions to Vcc+Vt to activate transistor 304. As such the data on bit line (BL) 300 is coupled to the selected block 350.

At time T2, the SGD signal is coupled to a level such as ½ VCC using supply 341. The $GWL_1$ and $GWL_2$ to GWLn voltages are increased at time T2 from ground to the intermediate voltage, Vpass. In one embodiment, Vpass is about 10 volts. The driver transistors 325 of word lines in unselected blocks 352 remain turned off via signal 326 to isolate the word lines from the GWL signals. The gate signal 324 for drive transistors 322 is increased from VCC to Vpgm+Vth, as explained above. As such, the word lines of the selected block 350 are coupled to Vpass.

At time T3, to program the selected block, the $GWL_1$ voltage level is increased from Vpass to the high program voltage, Vpgm. In one embodiment, Vpgm is about 20 volts. The selected word line $WL_1$ in the selected block 350 is coupled to $GWL_1$ to charge it to Vpgm through its respective driver transistor. The voltage levels of $GWL_2$ to GWLn remain at Vpass. With the selected word line $WL_1$ at Vpgm the selected memory cell $302_1$ is programmed.

As an option, at time T4 following the program operation, transistors 510 and 520 (via nodes 512 and 522) are activated while the precharge circuit 500 provides a voltage of zero volts. All of the word lines in selected and unselected blocks, therefore, are discharged.

A flash memory device, such as a NAND flash, has been described having an array of floating gate transistor memory cells arranged in a first and second addressable blocks. A voltage source to supply programming voltages to control gates of the floating gate transistor memory cells is provided. The voltage source supplies a pre-charge voltage to the control gates of the floating gate transistor memory cells located in the first addressable block when data is programmed in memory cells of the second addressable block. Methods for pre-charging word lines in unselected array blocks have been described.

The invention claimed is:

1. A method of programming a memory cell in a flash memory having first and second addressable blocks of floating gate memory cells, the method comprising:

- biasing a global word line conductor to a first non-zero voltage level;
- activating first transistors coupled between the global word line conductor and first word line conductors coupled to memory cells of the first addressable block, wherein the first word line conductors are charged to the first voltage level;
- biasing the global word line conductor to a second voltage level that is greater than the first voltage level; and
- activating second transistors coupled between the global word line conductor and second word line conductors coupled to memory cells of the second addressable block, wherein the second word line conductors are charged to the second voltage level.

2. The method of claim 1 further comprising activating the second transistors while the global word line conductor is biased to the first voltage level.

3. The method of claim 1 wherein the memory cell being programmed is located in the second addressable block.

4. The method of claim 1 further comprising activating the first and second transistors while the global word line conductor is coupled to ground potential to discharge the first and second word line conductors.

5. A method of programming a memory cell in a flash memory having first and second addressable blocks of floating gate memory cells, the method comprising:

- biasing a global word line conductor to a first non-zero voltage level;
- activating first transistors coupled between the global word line conductor and first word line conductors coupled to memory cells of the first addressable block, wherein the first word line conductors are charged to the first voltage level;
- biasing the global word line conductor to a second voltage level that is greater than the first voltage level;
- activating second transistors coupled between the global word line conductor and second word line conductors coupled to memory cells of the second addressable block, wherein the second word line conductors are charged to the second voltage level;
- biasing the global word line conductor to a third voltage level that is greater than the second voltage level; and
- activating a third transistor coupled between the global word line conductor and a selected word line conductor coupled to a memory cell to be programmed and located in the second addressable block, wherein the selected word line conductor is charged to the third voltage level.

6. The method of claim 5 wherein the second transistors and the third transistor are activated while the global word line conductor is biased to the first voltage level.

7. The method of claim 5 wherein the third transistor is activated while the global word line conductor is biased to the second voltage level.

8. The method of claim 5 wherein the first transistors are in-activated while the global word line conductor is biased to either the second or third voltage levels.

9. The method of claim 5 further comprising activating the first, second and third transistors while the global word line conductor is coupled to ground potential to discharge the first and second word line conductors.

10. A method of programming a memory cell in a flash memory having first and second addressable blocks of floating gate memory cells, the method comprising:

- activating first transistors coupled between a bias voltage circuit and first word line conductors coupled to memory cells of the first addressable block, wherein the bias voltage circuit provides a bias voltage to charge the first word line conductors to a first voltage level;
- biasing a global word line conductor to a second voltage level that is greater than the first voltage level; and
- activating second transistors coupled between the global word line conductor and second word line conductors coupled to memory cells of the second addressable block, wherein the second word line conductors are charged to the second voltage level.

11. The method of claim 10 further comprising discharging the first and second word line conductors after programming the memory cell.

* * * * *